United States Patent [19]
Sung

[11] Patent Number: 6,165,843
[45] Date of Patent: Dec. 26, 2000

[54] COVERED SLIT ISOLATION BETWEEN INTEGRATED CIRCUIT DEVICES

[75] Inventor: Kuo-Tung Sung, Hsinchu, Taiwan

[73] Assignee: Mosel Vitelic, Inc., Hsinchu, Taiwan

[21] Appl. No.: 09/048,832

[22] Filed: Mar. 20, 1998

[51] Int. Cl.[7] .............................................. H01L 21/8247
[52] U.S. Cl. ........................... 438/258; 438/424; 438/296
[58] Field of Search .................................... 438/296, 424, 438/257–267

[56] References Cited

U.S. PATENT DOCUMENTS

| | | | |
|---|---|---|---|
| 5,731,241 | 3/1998 | Jang et al. | 438/424 |
| 5,741,740 | 4/1998 | Jang et al. | 438/435 |
| 5,866,465 | 2/1999 | Doan et al. | 438/424 |
| 5,868,870 | 2/1999 | Fazan et al. | 148/33.3 |
| 5,923,992 | 7/1999 | Spikes et al. | 438/424 |
| 5,943,590 | 8/1999 | Wang et al. | 438/427 |
| 6,008,095 | 12/1999 | Gardner et al. | 438/296 |
| 6,020,230 | 2/2000 | Wu | 438/222 |

*Primary Examiner*—Richard Booth
*Attorney, Agent, or Firm*—Townsend and Townsend and Crew, LLP

[57] ABSTRACT

A capped slit provides isolation between adjacent devices of an integrated circuit. The cap and slit provide very high immunity to punchthrough and protect the edge of the slit against becoming exposed during subsequent processing that could otherwise remove field oxide. In one embodiment, the capped slit isolates two cells of a flash EEPROM device, and the field oxide lines the slit and serves as the tunneling oxide in the cells. In another embodiment, the slit is filled with a plug of dielectric material.

18 Claims, 8 Drawing Sheets

COVERED SLIT ISOLATION BETWEEN INTEGRATED CIRCUIT DEVICES

BACKGROUND OF THE INVENTION

The present invention relates to integrated circuits ("ICs") fabricated on semiconductor wafers and more particularly to electrically isolating adjacent devices of ICs from each other.

Integrated circuits have evolved from a handful of interconnected devices fabricated on a single chip of silicon to millions of devices. Current ICs provide performance and complexity far beyond what was originally imagined. In order to achieve the improvements in complexity and circuit density, i.e., the number of devices capable of being packed onto a given chip area, the size of the smallest device feature, also known as the device "geometry", has gotten smaller with each generation of ICs. Currently, devices are being fabricated with features less than a quarter of a micron across.

Increasing circuit density has not only improved the complexity and performance of ICs, but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility.

Shrinking device geometries have presented several issues to address. For example, devices on an IC are typically electrically isolated from each other. A variety of methods have evolved to accomplish this. Early bipolar ICs used depletion-region isolation between devices. These methods rely on essentially forming a reverse-biased isolation alley, or well, around each device or cell of the IC. A depletion-region isolation technique must allow for a large inactive area of the silicon surface between adjacent devices, which adversely affects IC packing densities. The consumption of chip area using this isolation technique became more pronounced as device geometries shrank and the area required for device isolation became a larger fraction of the total IC area.

Metal-oxide-semiconductor ("MOS") devices do not require the same type of isolating structure as bipolar devices, and ICs having the highest component densities are fabricated with MOS technologies. On way of isolating two adjacent MOS devices is with the local oxidation of silicon ("LOCOS") method. The LOCOS method relies on a relatively thick field oxide to be formed between devices. This thick field oxide reduces the chance that a conductive trace laying over the oxide will act as the gate of a parasitic transistor, linking one cell to another.

Figure 1A:
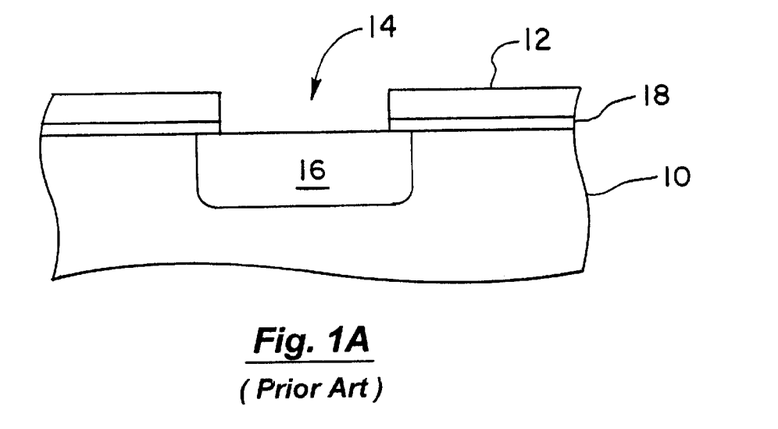
FIGS. 1A–1C are simplified cross sections of a wafer being processed to form a LOCOS type of isolated structure.
Figure 1B:
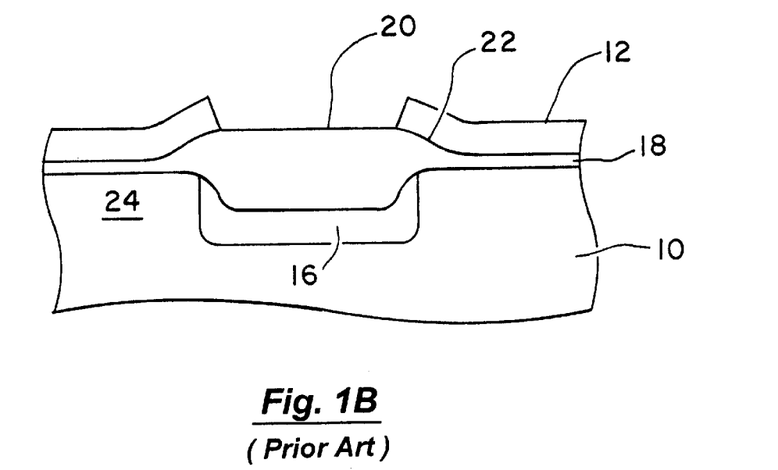
Figure 1C:
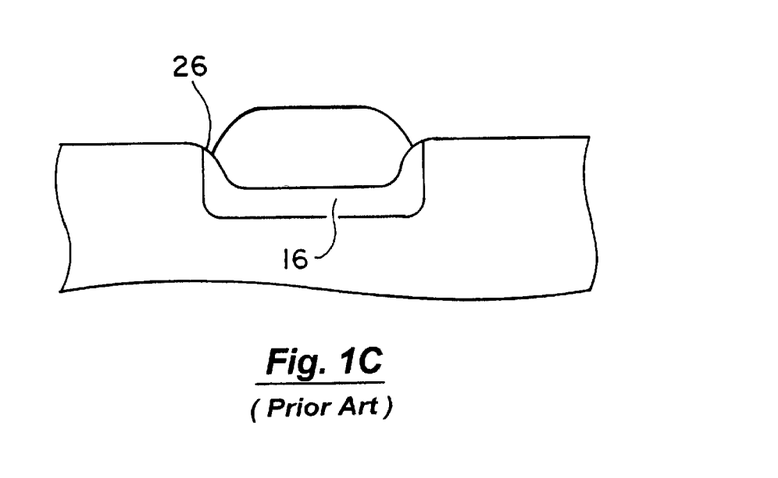

FIGS. 1A–1C show simplified cross sections of a silicon wafer during a LOCOS process. FIG. 1A shows a silicon wafer 10 with an oxidation mask layer 12 that has been patterned to form a window 14 that exposes the silicon. The oxidation mask is typically made of silicon nitride that has been formed by a chemical vapor deposition ("CVD") process. Ions may be implanted through the window 14 into the silicon wafer to form an isolation well 16. Oxygen and water vapor diffuse very slowly through the silicon nitride layer, compared to their rate of diffusion through silicon dioxide. A pad layer 18 of silicon dioxide is frequently grown on the silicon wafer using thermal oxidation means to cushion the surface stress between the oxidation mask 12 and the silicon wafer 10.

FIG. 1B shows the wafer after the field oxide growth step. A field oxide 20 is thermally grown, usually by a wet oxidation (steam) method. About 45% of the thermal field oxide growth is downward, and 55% is upward, the resulting layer of silicon oxide being thicker than the silicon it consumes. The oxidation mask layer 12 effectively prevents oxide from growing beneath it, although lateral diffusion of oxygen and steam, including diffusion along the pad layer 18 causes oxide to grow under the oxidation mask layer 12. The wedge 22 of field oxide that grows underneath the oxidation mask has been named a "bird's beak" because of its characteristic shape. The bird's beak is a lateral extension of the field oxide 20 into the active area 24 of a device.

FIG. 1C shows the wafer after the oxidation mask and pad oxide layers have been stripped. Stripping the pad oxide typically etches away part of the bird's beak oxide, and may expose a portion 26 of the isolation well 16. Subsequent processing, such as a nitric-hydrofluoric acid dip to remove polymer stringers following a polysilicon deposition and patterning process, may remove additional amounts of the bird's beak and further expose the isolation well.

Figure 2A:
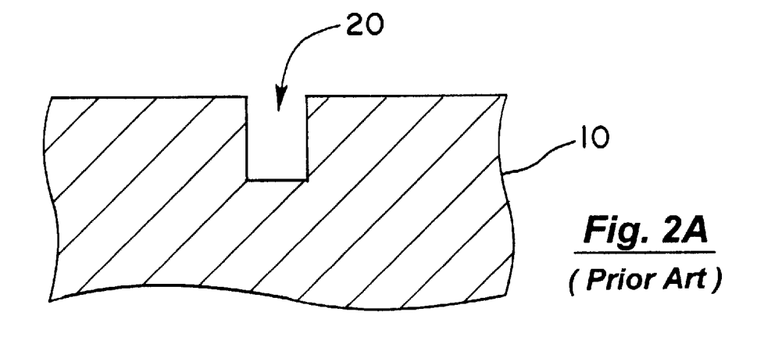
FIGS. 2A–2C are simplified cross sections of a wafer being processed to form a shallow-trench type of isolation structure.
Figure 2B:
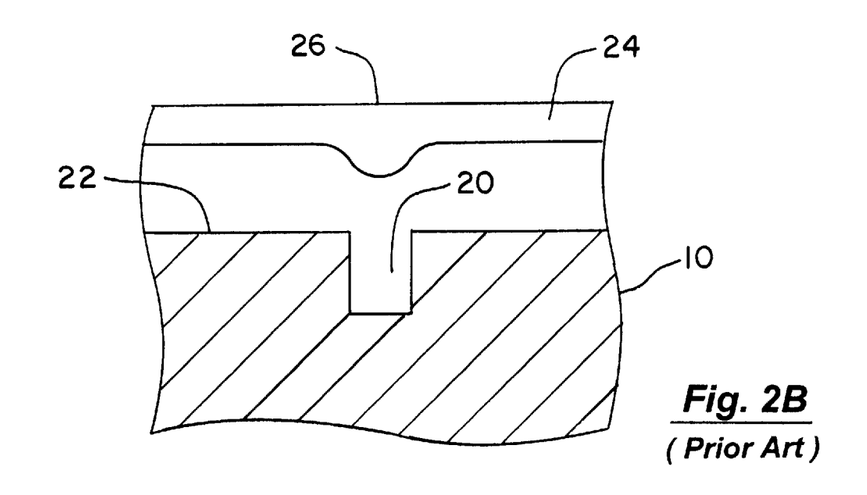
Figure 2C:
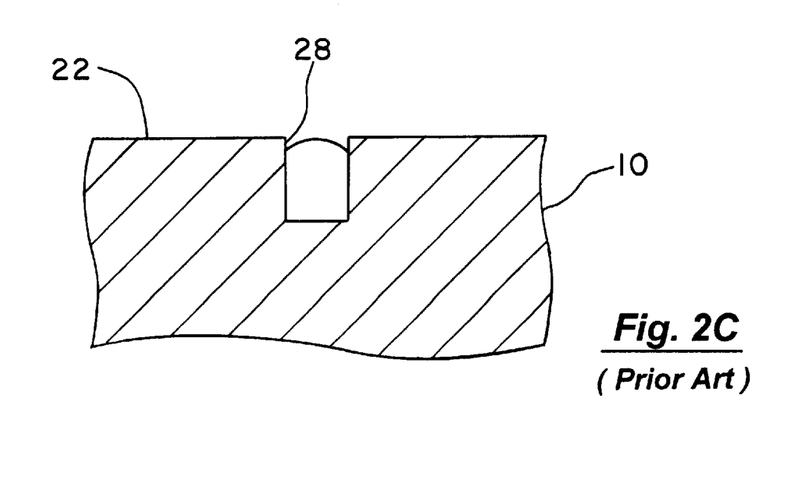

Another technique for isolating devices on an IC is shallow trench isolation ("STI"). FIGS. 2A–2C are simplified cross sections of a silicon wafer being processed according to an STI method. FIG. 2A shows a silicon wafer 10 with a trench 20 formed in the silicon. Dry etching techniques are typically used to form the trench, which is about 0.5–0.8 microns deep. FIG. 2B shows the silicon wafer 10 with CVD oxide filling the trench 20 and covering the field 22 of the wafer. A planarizing layer 24, for example of photoresist or spin-on glass, provides a flat surface 26 which may then be etched back with a technique, such as reactive ion etching, that etches the planarizing layer material and the CVD oxide material at the same rate. FIG. 2C shows the wafer 10 at the conclusion of the etchback step. To ensure that the CVD oxide is removed from the field 22, the field oxide is overetched. This overetching removes some of the CVD oxide below the surface of the wafer, thus exposing a portion of a sidewall 28 of the active area trench 20.

In either instance, the exposed portion of the isolation edge can cause at least two problems. First, the decrease in isolation width decreases the isolation between adjacent devices. Second, the gate oxide or tunnel oxide thickness at the exposed portion of the isolation edge is thinner than elsewhere, which may cause earlier breakdown. Therefore, it is desirable to provide an isolation structure that is not as susceptible to oxide loss at the edge of the field oxide due to subsequent processing.

From the above, it is seen that a technique for an improved integrated circuit device is highly desirable.

SUMMARY OF THE INVENTION

The present invention provides a technique, including a method and a device, for manufacturing an integrated circuit device. In an exemplary embodiment, the present invention provides a technique for isolating adjacent cells, or devices, in an integrated circuit such as a flash memory device.

In a specific embodiment, the present invention provides a novel method for producing an insulating region in a substrate. The method includes a step of forming a slit a semiconductor substrate, such as a silicon wafer or the like. A conformal dielectric layer is formed over the field of the substrate and the surfaces of the slit, including the edge of the slit. A capping layer is formed over the conformal dielectric layer, pinching off the slit to form a void. The capping layer is patterned to form a cap over the slit, particularly the edges of the slit covered by the conformal dielectric layer. In one embodiment, the integrated circuit is a flash EEPROM and the conformal dielectric layer serves as the tunneling dielectric layer for the floating gate of the memory cell.

The present isolation structure provides reliability for fabrication techniques which often require extensive etching (e.g., wet or dry), which often damages field isolation layers made using conventional techniques. The present invention also provides an efficient isolation structure between a high voltage region, which may be on the periphery of an integrated circuit, and a main cell region such as those for flash memory cells.

These and other embodiments of the present invention, as well as its advantages and features are described in more detail in conjunction with the text below and attached figures.

DESCRIPTION OF THE SPECIFIC EMBODIMENTS

Figure 3:
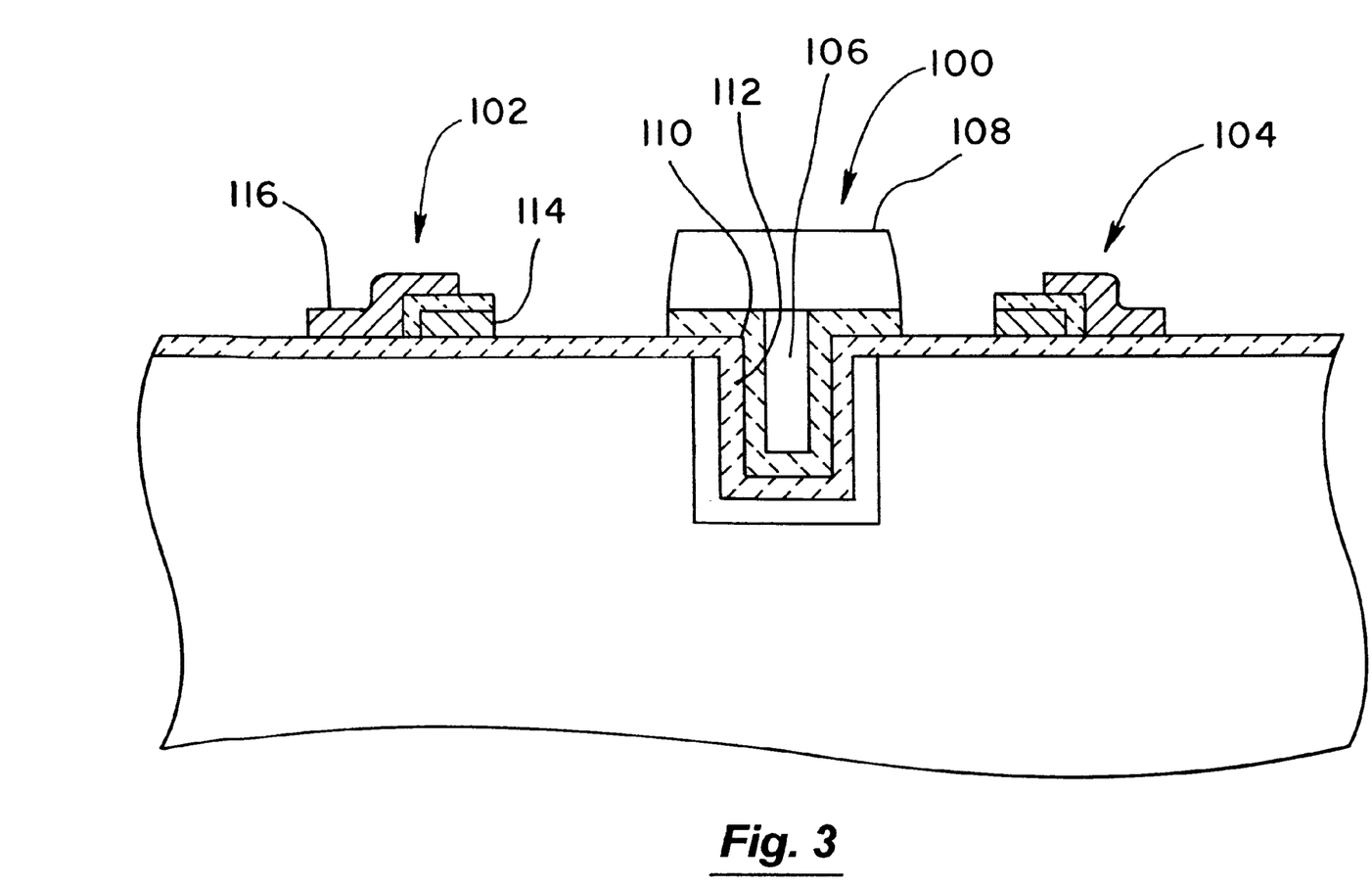
FIG. 3 is a simplified cross section of an isolation structure according to one embodiment of the present invention separating two cells of an EEPROM device.

FIG. 3 is a simplified cross section of a portion of an integrated circuit. An isolation structure 100 is placed between two cells 102, 104 of a flash electronically erasable, programmable, read only memory ("flash EEPROM") device, although such a device is used for purposes of illustration only. The isolation structure utilizes an air-filled trench, or slit 106, with a cap 108 that protects the edges 110 or sidewalls 112 of the slit from becoming exposed during subsequent processing of the device. Such protection is particularly relevant for use with flash EEPROM type circuits because of the multiple layers of polysilicon that are deposited and patterned on such devices. A flash EEPROM often has a floating gate 114 and another gate, such as a control gate 116, both of which may be made of polysilicon.

When polysilicon is patterned, polymer stringers often form that adversely affect the operation or reliability of the device. The wafers are often dipped in a wet etch solution that contains hydrofluoric acid to dissolve the stringers. However, these dips also attack oxides, such as isolation oxides. As discussed above, the removal of isolation oxide lowers the isolation between adjacent cells. This problem is particularly acute with EEPROM circuits for at least two reasons.

First, the presence of multiple layers of polysilicon (used for the various gates in an EEPROM device) typically require multiple dips as part of the patterning process for each polysilicon layer, thus removing more isolation oxide than would be removed in processes with fewer polysilicon layers. Second, EEPROMs typically operate at two voltages. A lower voltage is used to sense, or read, the state of a floating gate, and is usually in the 1.5–5 V range typical of many memory circuits. A higher voltage is used to program the state of the floating gate. The higher voltage is typically about twice as high as the lower voltage, and the isolation between cells must be able to withstand this higher voltage.

Figure 4A:
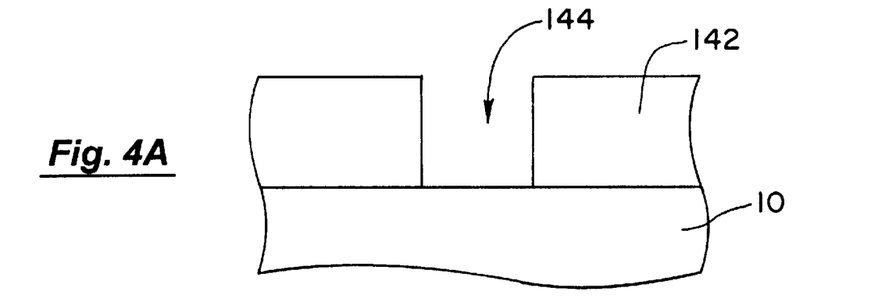
FIGS. 4A–4H are simplified cross sections of a wafer being processed to form an isolation according to one embodiment of the present invention.

FIG. 4A is a simplified cross section of a silicon wafer 10 with a thick oxide layer 142 that would be patterned using standard photolithographic methods to define an aperture 144 in the oxide layer. The thick oxide layer 142 will be used as an etch mask for a trench etch step. The mask used to define the aperture may have a dimension for open areas of between about 0.4–1.0$\mu$, but the actual trench width can be changed by the use of a trench sidewall spacer. The thick oxide layer 142 would be sufficiently thick to operate as an etch mask during the trench formation process. The exact thickness chosen will depend on the desired trench depth and the etch selectivity between the thick oxide layer and the silicon, among other factors. The etch selectivity depends upon the type of oxide layer and the etch chemistry used to form the trench, among other factors. In one example, the thick oxide would be 3,000 Å thick and would be formed using a low-pressure tetraethylorthosilane CVD process ("LPTEOS CVD"). This thick oxide layer should be sufficient to provide an etch mask to form a 0.4$\mu$ deep trench in the silicon.

Figure 4B:
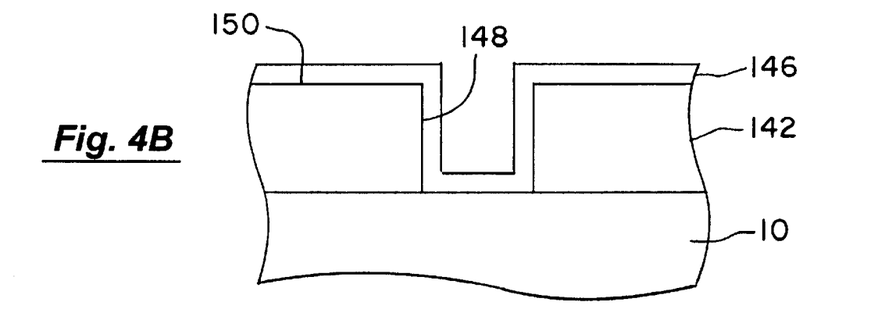

FIG. 4B is a simplified cross section of the wafer 10 with a spacer layer 146 of oxide over the thick oxide layer 142. The spacer layer would also be formed using a LPTEOS CVD process. A spacer layer 0.1$\mu$ on each side could be used, but the thickness may be varied according to the desired spacer width. Use of a space layer would allow a critical dimension less than the critical dimension resulting from the preceding photolithographic process. The LPTEOS CVD process produces a substantially conformal layer, so the thickness of the spacer layer 146 on the sidewall 148 of the thick oxide layer 142 would be approximately the same as the thickness of the spacer layer on the field 150 of the thick oxide layer.

Figure 4C:
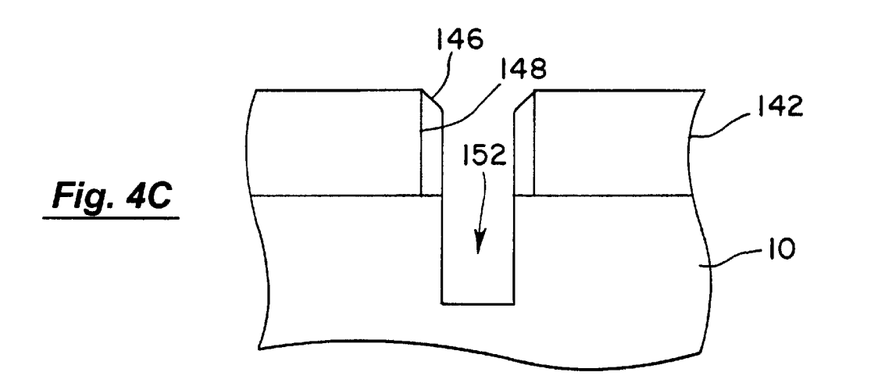
Figure 4D:
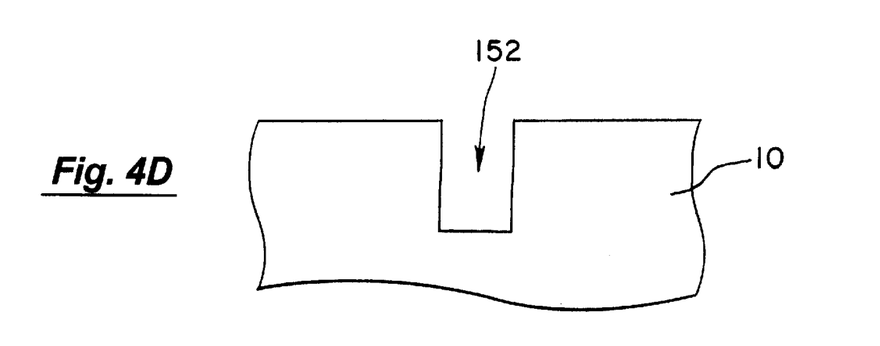

FIG. 4C is a simplified cross section of the wafer 10 after a two-step etch process. During the first etch step, the spacer layer would be etched using an anisotropic plasma etch process suitable for removing silicon dioxide to leave the spacer layer 146 on the sidewall 148 of the thick oxide layer 142. This etch step would be stopped when removal of the spacer layer exposed the underlying silicon. The second etch step would be performed using an anisotropic etch process suitable for removing silicon to form a slit 152 approximately 0.4$\mu$ deep. FIG. 4D shows the wafer 10 and the slit 152 with the remaining thick oxide layer and spacer layer removed, by using a wet-etch process or isotropic plasma etch process, for example.

Figure 4E:
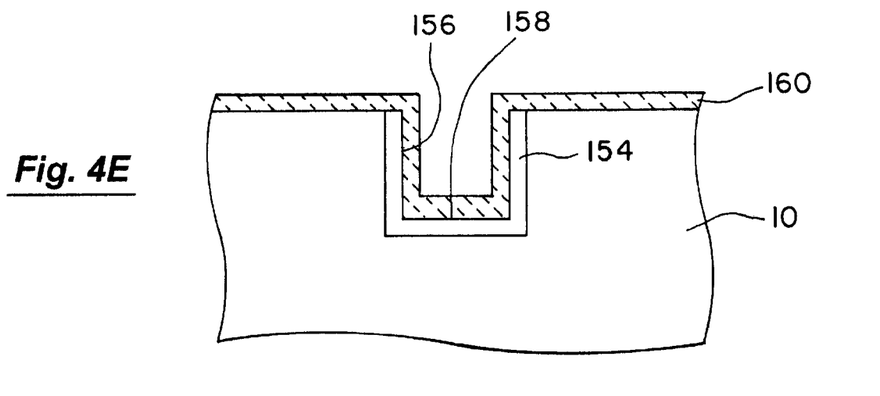

FIG. 4E is a simplified cross section of the wafer 10 after an optional ion implantation step. An implanted layer 154 may be formed around the slit walls 156 and bottom 158 by ion implanting a dopant species into the slit. A separate masking step would define the areas for implanting. If the silicon wafer 10 were an n-type wafer, for example, boron could be implanted. A sidewall oxide 160 would be formed to cover the walls and bottom of the slit. The sidewall oxide could be formed using a thermal or CVD, including a plasma CVD, process, for example, and could be the gate or tunneling dielectric layer in a FET- or EEPROM-type device. Generally, such a dielectric layer is a high-quality dielectric layer so that it doesn't degrade from the transfer of electrons to and from a floating gate.

Figure 4F:
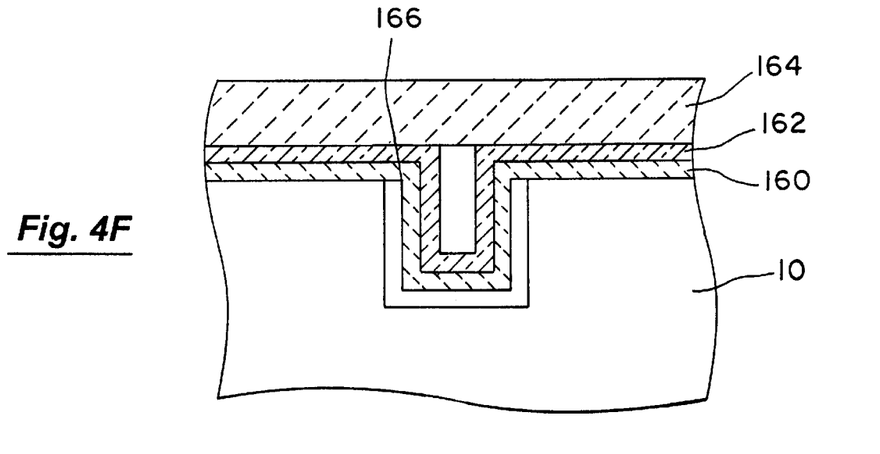

FIG. 4F is a simplified cross section of the wafer 10 with a silicon nitride layer 162 and a capping layer 164 formed over the sidewall oxide layer 160. The silicon nitride layer could be 200 Å thick and formed using a CVD process, for example, and provides an etch-stop layer for a subsequent oxide etch step, as well as further narrowing the slit and providing further dielectric passivation of the walls and corners 166 of the slit. The capping layer would be a relatively thick layer, for example 3,000 Å, of silicon oxide formed by an LPTEOS CVD process. The thickness of the capping layer would be chosen to be sufficient to cover the slit during subsequent wet etch and dry etch processing of the wafer. The silicon nitride etch layer allows the capping layer to be overetched to insure that the capping layer is entirely removed from the field areas of the device. Overetching is particularly important when etching such a thick layer, especially on large wafers, as etching uniformity varies across the wafer.

The conformal characteristic of LPTEOS CVD layers tends to "pinch-off" the openings of narrow slits, as the oxide deposits build up on the corners or edges of the slits to form overhangs, which eventually grow together. Conventional processes have gone to great lengths to avoid this effect so that the entire trench may be filled with a solid, gap-free dielectric material. One consequence of these approaches is that only trenches that are sufficiently wide may be filled in a gap-free manner. Conversely, the present invention allows very narrow trenches to be utilized for isolation structures by recognizing that the accumulation of dielectric material on the edges of a slit may be used to beneficially form a cap over the slit. The capping layer 164 may optionally be densified, for example by heat treating, exposure to steam, or exposure to a plasma.

Figure 4G:
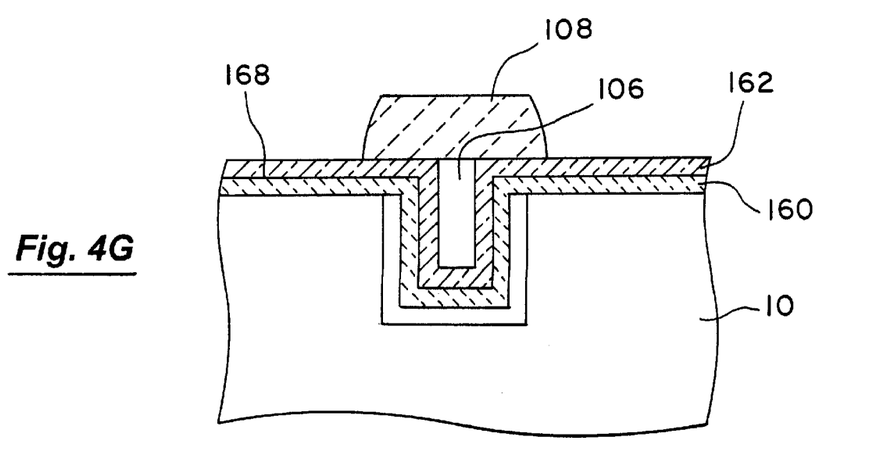

FIG. 4G is a simplified cross section of a wafer 10 with a cap 108 formed over the slit 106. The silicon nitride layer 162 would provide an etch stop layer. An active cell mask can be used to define the field oxide region 168 and the cap 108. The length of the cap would be longer than the width of the slit 106, in this instance, the cap would be about 0.1–0.15$\mu$, while the slit would be narrower.

Figure 4H:
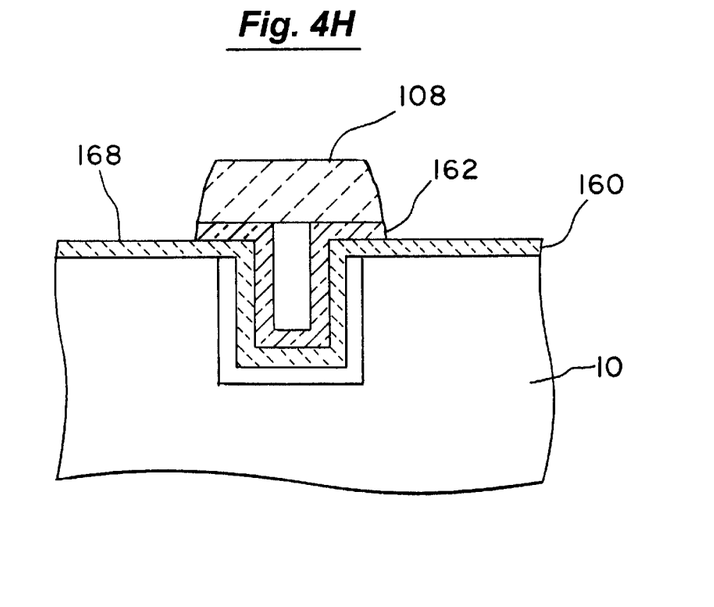

FIG. 4H is a simplified cross section of a wafer 10 with the cap 108 on the silicon nitride layer 162. The silicon nitride layer has been removed from the field 168 using an etch process that is selective for silicon nitride. In this manner, it is possible to achieve an isolation structure that has very high immunity to punchthrough and is equal in size to the critical dimension of the photolithographic process used, i.e. the length of the cap, while providing a uniform sidewall oxide 160 that is protected at the edges of the slit that by the oversized, overlying cap. Alternatively, the silicon nitride layer could be left on the sidewall oxide layer as part of a gate dielectric or tunneling dielectric layer.

Figure 5:
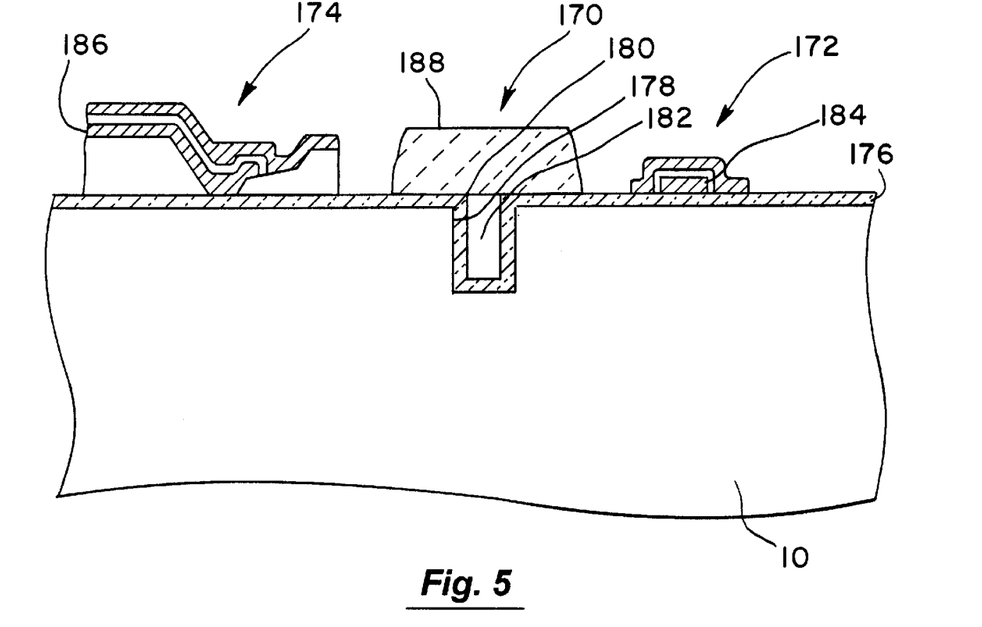
FIG. 5 is a simplified cross section of an isolation structure, including a void, separating two cells of an EEPROM device.

FIG. 5 is a simplified cross section of an isolation structure 170 formed between a first cell 172 and a second cell 174 of a flash EEPROM. A silicon nitride layer 176 isolates the sidewalls 178 and the edges 180 of a slit 182. The silicon nitride layer also acts as a tunneling layer for the floating gates 184, 186. Alternatively, a silicon oxynitride layer could be substituted for the silicon nitride layer 176. A cap 188 is formed over the slit 182 and the edges 180 of the slit as described above. The silicon nitride layer acts as an etch stop when forming the cap. The thickness of the tunneling layer is chosen to provide a barrier at the normal read-write operating voltage of the EEPROM, while allowing tunneling or injection of electrons either to or from the floating gate when that gate is selected for charging or discharging. In some instances, the silicon nitride layer, which is typically tensile when formed over silicon, is sufficiently thin as to not induce defects resulting from tensile stress, and does not require a pad layer, as with the LOCOS process.

Figure 6A:
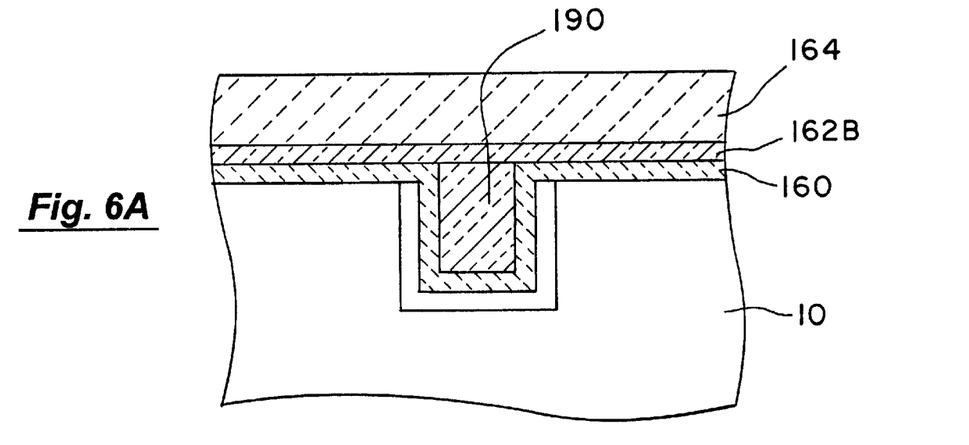
FIGS. 6A–6C are simplified cross sections of a wafer being processed to form an isolation structure according to another embodiment of the present invention.

FIG. 6A is a simplified cross section of the wafer 10, according to an alternative embodiment. After the wafer has been processes as shown in FIG. 4E, a plug 190 of dielectric material is formed in the slit to fill it. The plug may be formed by any of or a combination of several processing techniques, including LPTEOS CVD, plasma-enhanced CVD, high-density plasma CVD, and spin-on glass techniques, and may be silicon glass, doped silicon glass, or other dielectric material. For simplicity, the plug 190 is shown as being planarized with the top surface of the pad oxide 160, but does not have to be planar as both the subsequent silicon nitride layer 162B and the capping layer 164 are conformal, and would smooth minor irregularities caused by a non-planarized plug. Alternatively, the plug can be formed to fill the slit remaining after a silicon nitride layer has been deposited.

Figure 6B:
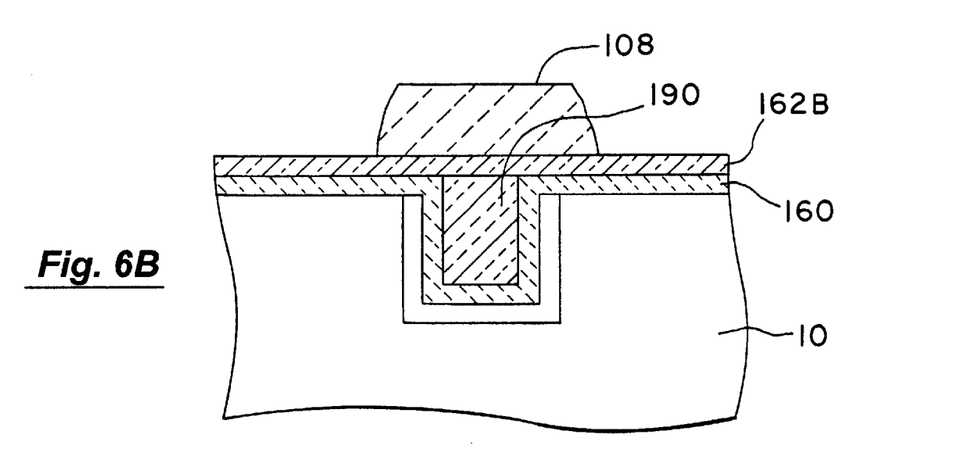

FIG. 6B is a simplified cross section of a wafer 10 with a cap 108 formed over the filled over the plug-filled slit. The silicon nitride layer 162B provides an etch stop layer. An active cell mask can be used to define the field oxide region and the cap 108. The length of the cap would be longer than the width of the slit.

Figure 6C:
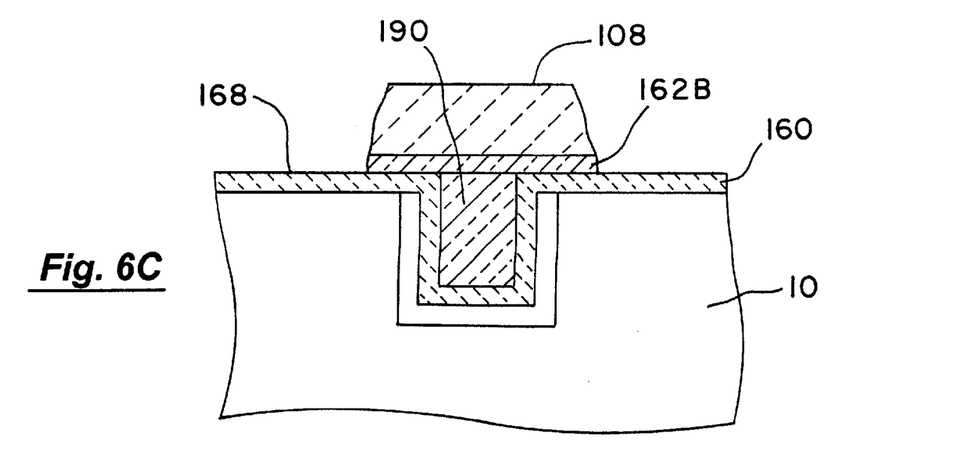

FIG. 6C is a simplified cross section of a wafer 10 with the cap 108 on the silicon nitride layer 162B. The silicon nitride layer has been removed from the field 168 using an etch process that is selective for silicon nitride. In this manner, it is possible to achieve an isolation structure that has very high immunity to punchthrough and is equal in size to the critical dimension of the photolithographic process used, i.e. the length of the cap, while protecting the edges of the slit from exposure during subsequent processing by using a cap that is longer than the slit.

Figure 7:
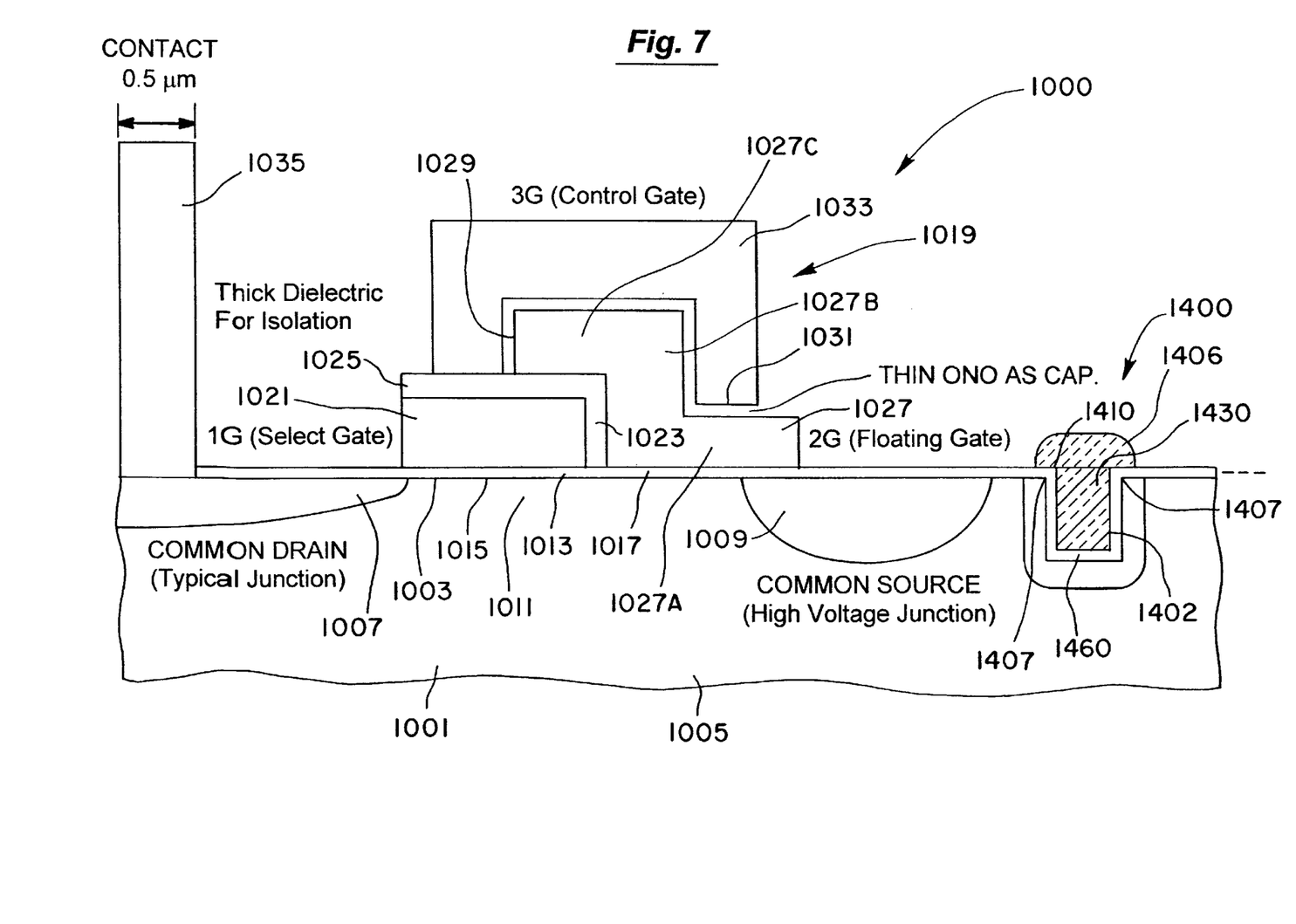
FIG. 7 is a simplified cross section of an isolation structure, including a filled trench, separating two cells of a flash memory device.

FIG. 7 illustrates how the present invention can be applied to an improved flash memory cell 1000. This diagram is merely an illustration and should not limit the scope of the claims. One of ordinary skill in the art would recognize other variations, alternatives, and modifications. Memory cell 1000 is defined in substrate 1001, which includes an upper surface 1003 that is substantially planar in geometry. A well region 1005 is defined in the substrate. The well region 1005 has a drain region 1007 and a source region 1009. In some embodiments, the drain region is a common drain region, which is shared by another memory cell. Similarly, the source region can be a common source region, which is shared by another memory cell. Between the source region and the drain region is a channel region 1011. The source and drain regions are made using implantation techniques, but can also be made using plasma immersion ion implantation or the like. A dielectric layer 1013, including a gate dielectric layer 1015 and a tunnel dielectric layer 1017, is defined overlying the channel region 1011. These dielectric layers can be made using a suitable material including silicon dioxide, silicon nitride, silicon oxynitride, and others. In the context of this embodiment, the gate dielectric and tunnel dielectric layers are made of high quality silicon dioxide. The tunnel dielectric layer is substantially uniform and substantially pinhole free. Additionally, the tunnel dielectric layer can withstand numerous programming and erase cycles.

The memory cell 1000 also includes a novel gate structure 1019. In particular, the gate structure 1019 includes a select gate 1021, which is defined from a first polysilicon layer, e.g., poly-1. The select gate is made from a polysilicon layer that is doped using N-type impurities. In some embodiments, the impurities are diffused using a $POCl_3$ compound or the like. Alternatively, the gate can be in-situ doped using a phosphorous bearing compound or the like. In further embodiments, the polysilicon layer can be laid in an amorphous state, which is later crystallized. The amorphous state generally produces a smoother polysilicon layer. The select gate overlies gate oxide and extends to the drain region. A sidewall spacer 1023 and an overlying insulating layer 1025 are defined overlying the select gate. The sidewall spacer and the insulating layer insulate and isolate the select gate from overlying circuit elements, e.g, a control gate 1033 or a floating gate 1027. The select gate also has a channel region ranging from about 0.2 microns and less or about 1.0 microns and less, but is not limited to these ranges. Additionally, the select gate has a thickness of about 500 Angstroms and less and about 3500 Angstroms and less, but is not limited to these ranges.

The gate structure 1019 also includes a split floating gate 1027 overlying a portion of the upper surface of the substantially planar substrate, and also overlaps a portion of the select gate, which is defined overlying the planar surface of the substrate. That is, the split floating gate is defined overlying insulating layer 1025, which forms overlying the top surface of the select gate. The split gate also overlies an edge(s) including sidewall spacer 1023 of the select gate.

The split gate 1027 also has an edge 1029 overlying a region on the top surface of the select gate 1021. Split floating gate 1027 also extends from the select gate to a region overlying tunnel dielectric layer 1017 and extends to source region 1009. Accordingly, the split gate has at least three regions, including a lower horizontal region 1027A overlying the planar surface (which includes the tunnel oxide and the source/drain region), a vertical region 1027B overlying an edge or sidewall spacer of the select gate, and an upper horizontal region 1027C overlying the top surface of the select gate. The lower horizontal region 1027A, the vertical region 1027B, and the upper horizontal region 1027C define the split gate structure.

The split gate 1027 can be made of any suitable material such as, for example, polysilicon, e.g., poly-2. In most embodiments, the split gate is made from a polysilicon layer that is doped using N-type impurities. In some embodiments, the impurities are diffused using a $POCl_3$ compound or the like. Alternatively, the floating gate can be in-situ doped using a phosphorous bearing compound or the like. In further embodiments, the polysilicon layer can be laid in an amorphous state, which is later crystallized, rather than the polycrystalline state. The amorphous state generally produces a smoother polysilicon layer.

A dielectric layer(s) 1031 is defined overlying the floating gate. The dielectric layer forms along edges of the floating gate, which are over the select gate. Additionally, the dielectric layer overlies the top surface of the upper horizontal region, overlies an outer surface of the vertical region, and extends over the lower horizontal region of the floating gate structure. Of course, the type of dielectric layer used depends highly upon the size and shape of the floating gate and control gate. The dielectric layer 1031 can be any suitable layer or combinations of layers such as an oxide-on-nitride-on-oxide, which is commonly termed "ONO." The dielectric layer can also be a single nitride layer or a single oxide layer depending upon the application. Either CVD or thermal techniques can be used to form the dielectric layer or layers. The dielectric layer insulates and isolates the floating gate from a control gate 1033.

Control gate 1033 forms overlying the dielectric layer 1031, which is sandwiched between the floating gate and the control gate. The control gate is defined overlying edge 1029 of the floating gate, which is over a top portion of the select gate. The control gate also forms overlying the upper horizontal region, the vertical region, and the lower horizontal region of the floating gate. The control gate can be made of any suitable material such as, for example, polysilicon, e.g., poly-3. In most embodiments, the control gate is made from a polysilicon layer that is doped using N-type impurities. In some embodiments, the impurities are diffused using a $POCl_3$ compound or the like. Alternatively, the control gate can be in-situ doped using a phosphorous bearing compound or the like. In further embodiments, the polysilicon layer can be laid in an amorphous state, which is later crystallized, rather than the polycrystalline state. The amorphous state generally produces a smoother polysilicon layer.

A contact 1035 is defined overlying the drain region. Contacts are also defined on the select gate, the control gate, and the source region (not shown). These contacts can be made using a variety of techniques. For example, the contacts can be made using a combination of metals such as aluminum with a barrier metal such as titanium nitride, titanium tungsten, and others. Alternatively, the contacts can be made using a tungsten layer or copper layer with a barrier metal. Furthermore, the contacts can be made from "plugs" such as tungsten plugs, polysilicon plugs, aluminum plugs, and the like. The plugs can be used with or without a barrier layer, or can also be grown in a selective manner. Of course, the type of contacts used depends highly upon the application.

In the present embodiment, the gate coupling ratio or GCR is increased by way of the present novel transistor design. GCR increases by increasing the area of the floating gate that is capacitively coupled to the control gate relative to the area of the floating gate that is capacitively coupled to the tunnel oxide overlying the active cell region. As shown, the control gate couples to the floating gate through exposed surfaces of edge 1029, upper horizontal region 1027C, and vertical region 1027B. Floating gate couples to the tunnel oxide through the lower horizontal region 1027A. Accordingly, control gate couples to the floating gate through at least two additional surface regions. Ideally, GCR approaches one in embodiments of the present invention. Practically, however, it is quite difficult for GCR to equal one. Accordingly, GCR ranges from values greater than 0.3, or greater than 0.5, or greater than 0.6, or greater than 0.8 in the embodiments of the present invention, although GCR is not limited to these values. The exact value of GCR depends upon the particular geometric configuration of the floating gate as well as the design rule of the device. Of course, the final GCR value will depend upon the particular application.

In a specific embodiment, the present memory cell can be programmed and erased by placing voltages on selected gate structures. To program the floating gate or add electrons to the floating gate, selected voltages are applied to the gate structures and source/drain regions. Electrons migrate from the source region through the channel region and inject through the tunnel oxide layer to the floating gate, where electron charge builds up. To erase the floating gate or remove electrons from the floating gate, selected voltages are applied to the gate structures and the source/drain regions. Electrons migrate from the floating gate through the tunnel oxide layer to the channel region and out through the drain region.

The embodiment described above is merely a single flash memory device with a novel gate structure. Integrated circuits include one or more of these devices in a cell. Thousands, millions, billions, and even trillions of these devices are formed in a single integrated circuit chip. Thus, the integrated circuit chip can have 4 Meg., 16 Meg. 64 Meg. 256 Meg., 1 Gig. or more devices on a single sliver of silicon. The channel length of these devices ranges from about 0.4 micron to 0.25 micron and less. The flash memory device can be formed in a stand alone integrated circuit chip, commonly termed the FLASH memory chip, in some embodiments. Alternatively, the flash memory device can be integrated into a microprocessor, microcomputer, digital signal processor, application specific integrated circuit, and the like. Of course, the number of cells and design size depend highly upon the application.

An isolation structure 1400 separates memory cell 1000 from a second memory cell (not shown). The isolation structure 1400 includes a plug of dielectric material 1430 formed in a slit or trench 1402 with a cap 1406 covering the plug 1430 and the edges 1410 of a sidewall oxide 1460. In this embodiment, the cap 1406 also covers the corners 1407 of the trench 1402. Alternatively, the plug may be omitted, and/or additional layers of materials, such as a silicon nitride etch-stop layer, or other features may be incorporated into the isolation structure 1400.

While the above is a complete description of specific embodiments of the present invention, various modifications, variations, and alternatives may be employed. For example, the wafer could be a semiconductor-on-insulator type of wafer, or a wafer other than a silicon wafer. The present invention could be adapted to other types of wafers and materials with appropriate selection of materials and processes. Other variations will be apparent to persons of skill in the art, such as using halogenated oxide layers. These equivalents and alternatives are intended to be included within the scope of the present invention. Therefore, the scope of this invention should not be limited to the embodiments described, and should instead be defined by the following claims.

What is claimed is:

1. A method for forming an isolation structure on a substrate for an integrated circuit device, the method comprising:
    (a) defining a slit in the substrate, the slit having a sidewall and an edge;
    (b) forming a conformal dielectric layer over a field region of the substrate and over the sidewall;
    (c) forming a capping layer over the conformal dielectric layer and over the slit, said capping layer defining a void in said slit; and
    (d) patterning the capping layer to remove the capping layer from a first portion of the conformal dielectric layer and to form a cap over a second portion of the conformal dielectric layer and over the slit.

2. The method of claim 1 wherein the integrated circuit device is a flash EEPROM device, the slit being disposed between a first memory cell and a second memory cell of the flash EEPROM device.

3. The method of claim 1 wherein the slit is defined by an etch process including:
    defining an aperture in an etch mask layer, the aperture having a critical minimum dimension and aperture walls;
    forming spacers on the aperture walls; and
    etching the slit so that the slit has a width less than the critical minimum dimension.

4. The method of claim 1 further including:
    after said forming said conformal dielectric layer and before said forming said capping layer, forming an etch stop layer over the conformal dielectric layer; and
    after said patterning, removing the etch stop layer where the etch stop layer is not covered by the cap.

5. The method of claim 1 further including a step of ion implanting a dopant species into the slit prior to said forming said capping layer.

6. A method for forming an isolation structure on a substrate for an integrated circuit device, the method comprising:
    (a) defining a slit in the substrate, the slit having a sidewall and an edge;
    (b) forming a conformal dielectric layer over a field region of the substrate and over the sidewall;
    (c) forming an etch stop layer over the conformal dielectric layer;
    (d) forming a capping layer over the conformal dielectric layer and over the slit, said capping layer defining a void in said slit;
    (e) patterning the capping layer to remove the capping layer from a first portion of the conformal dielectric layer and to form a cap over a second portion of the conformal dielectric layer and over the slit; and
    (f) removing the etch stop layer where the etch stop layer is not covered by the cap.

7. A method for forming an isolation structure on a substrate for an integrated circuit device, the method comprising steps of:
    (a) defining a slit in the substrate, the slit having a sidewall and an edge;
    (b) forming a conformal dielectric layer over a field region of the substrate and over the sidewall;
    (c) filling the slit with a dielectric material;
    (d) forming a capping layer over the conformal dielectric layer and over the dielectric material in the slit; and
    (e) patterning the capping layer to remove the capping layer from a first portion of the conformal dielectric layer and to form a cap over a second portion of the conformal dielectric layer and over the slit.

8. The method of claim 7 wherein the integrated circuit is a flash EEPROM device, the slit being disposed between a first memory cell and a second memory cell of the flash EEPROM device.

9. The method of claim 7 wherein the slit is defined by an etch process including steps of:
    defining an aperture in an etch mask layer, the aperture having a critical minimum dimension and aperture walls;
    forming spacers on the aperture walls; and
    etching the slit so that the slit has a width less than the critical minimum dimension.

10. The method of claim 7 further including steps of:
    after the step (c) and before the step (d), forming an etch stop layer over the conformal dielectric layer; and
    after the step (e), removing the etch stop layer where the etch stop layer is not covered by the cap.

11. The method of claim 7 further including a step of ion implanting a dopant species into the slit prior to the step (c).

12. A method for forming an integrated circuit substrate, the method comprising:
    (a) providing a substrate, the substrate comprising a first active region and a second active region, the first active region corresponding to a flash memory cell region, and the second active region corresponding to a high voltage device region;

(b) forming a slit in the substrate between the first active region and the second active region, the slit having a sidewall and an edge to isolate the first active region from the second active region;

(c) forming a conformal dielectric layer over the substrate and over the sidewall;

(d) forming a capping layer over the conformal dielectric layer and over the slit to pinch off the slit, thereby defining a void in the slit; and (e) patterning the capping layer to remove the capping layer from a first portion of the conformal dielectric layer and to form a cap over a second portion of the conformal dielectric layer and over the slit;

(f) wherein said slit, said cap, and said void define an isolation structure, said isolation structure being capable of withstanding etching processes which occur in said first active region without substantial damage to said isolation structure.

13. The method of claim 12 wherein the slit is defined by an etch process including:

defining an aperture in an etch mask layer, the aperture having a critical minimum dimension and aperture walls;

forming spacers on the aperture walls; and etching the slit so that the slit has a width less than the critical minimum dimension.

14. The method of claim 1 further comprising densifying said capping layer.

15. The method of claim 14 wherein said densifying said capping layer comprises a heat treatment.

16. The method of claim 1 wherein a width of said cap is greater than a width of said slit.

17. The method of claim 12 further comprising densifying said capping layer.

18. The method of claim 12 wherein a width of said cap is greater than a width of said slit.

* * * * *